US008428532B2

(12) United States Patent
Romain et al.

(10) Patent No.: US 8,428,532 B2
(45) Date of Patent: Apr. 23, 2013

(54) HIGH-FREQUENCY RECEIVER WITH MULTIPLE-CHANNEL DIGITAL PROCESSING

(75) Inventors: Olivier Romain, Montgeron (FR); Bruce Denby, Paris (FR); Julien Denoulet, Noisy-le-Grand (FR)

(73) Assignee: Universite Pierre et Marie Curie (Paris VI), Paris (FR)

( * ) Notice: Subject to any disclaimer, the term of this patent is extended or adjusted under 35 U.S.C. 154(b) by 348 days.

(21) Appl. No.: 12/450,773

(22) PCT Filed: Apr. 10, 2008

(86) PCT No.: PCT/FR2008/000499
§ 371 (c)(1),
(2), (4) Date: Feb. 3, 2010

(87) PCT Pub. No.: WO2008/142278

PCT Pub. Date: Nov. 27, 2008

(65) Prior Publication Data
US 2010/0178894 A1    Jul. 15, 2010

(30) Foreign Application Priority Data

Apr. 12, 2007   (FR) ..................................... 07 02668

(51) Int. Cl.
*H04B 1/06* (2006.01)
(52) U.S. Cl.
USPC ...................... 455/232.1; 455/324
(58) Field of Classification Search ............... 455/232.1, 455/324; 375/350
See application file for complete search history.

(56) References Cited

U.S. PATENT DOCUMENTS

| 4,864,638 | A | * | 9/1989 | Zwarts | 455/205 |
| 5,627,861 | A | * | 5/1997 | Kataoka | 375/324 |
| 6,031,418 | A |   | 2/2000 | Fowler | |
| 7,305,057 | B1 | * | 12/2007 | Miao | 375/350 |
| 7,477,886 | B1 | * | 1/2009 | Wong | 455/314 |
| 7,646,807 | B1 | * | 1/2010 | Manickam et al. | 375/232 |
| 7,656,327 | B2 | * | 2/2010 | Filipovic et al. | 341/139 |
| 2002/0196860 | A1 | * | 12/2002 | Ohtaki | 375/260 |
| 2003/0063679 | A1 |   | 4/2003 | Scrofano | |
| 2007/0184782 | A1 | * | 8/2007 | Sahota et al. | 455/63.1 |

OTHER PUBLICATIONS

International Search Report for PCT/FR2008/000499, mailed Nov. 20, 2008.
Database Inspec [Online] The Institution of Electrical Engineers, Stevenage, GB; Oct. 16, 2006, Wang et al., "Channelized Receiver with WOLA Filterbank", XP002463288.
Wang et al., Channelized Receiver with WOLA Filterbank, Proceedings of 2006 CIE International Conference on Radar Oct. 16-19, 2006, Shanghai, China, vol. 2 XP 002467123.
Denby et al., "A Software Radio Approach to Commercial FM Content Indexing", Sep. 13-15, 2004, pp. 63-66, XP002467124.

(Continued)

*Primary Examiner* — Lana N Le
(74) *Attorney, Agent, or Firm* — Nixon & Vanderhye P.C.

(57) ABSTRACT

In the receive subsystem, the analogue-to-digital converter (40) works on the output of the low-noise amplifier (33), at a chosen rate (F), which corresponds to a bandwidth sampling. The processing stages comprise a custom circuit (5), with * an input memory (510) arranged to contain N successive digital samples, renewed at the chosen rate in blocks of M samples, * a complex digital low-pass filtering function (511, 512), of chosen cut-off frequency, operating on the input memory to supply N filtered digital samples (515), * an M-periodic summing function (531) on the N filtered digital samples, supplying M filtered and summed digital samples (533), * an M'M discrete Fourier transform stage (55), operating on these M filtered and summed digital samples, the digital signals on the M outputs (559) of the Fourier transform representing M separate channels, of width defined by the cut-off frequency of the abovementioned low-pass filter.

9 Claims, 6 Drawing Sheets

OTHER PUBLICATIONS

Database Inspec [online], The Institution of Electrical Engineers, Stevenage, GB;, Sep. 15, 2004, Denby et al., "A Software Radio Approach to Commercial FM Content Indexing", XP002463289.

Howland et al., "FM Radio Based Bistatic Radar—Passive Radar Systems", IEE Proceedings: Radar, Sonar & Navigation, Institution of Electrical Engineers, GB, vol. 152, No. 3, Jun. 3, 2005, pp. 107-115, XP006024052.

Romain et al., "Prototype of a Software-Defined Broadcast Media Indexing Engine", IEEE International Conference on Acoustics, Speech, and Signal Processing, Apr. 15-20, 2007, Honolulu, HI, USA, pp. II-813, XP002467125.

Database Inspec [online], The Institution of Electrical Engineers, Stevenage, GB; Apr. 20, 2007, Olivier et al., "Prototype of a Software-Defined Broadcast Media Indexing Engine", XP002463290.

* cited by examiner

HIGH-FREQUENCY RECEIVER WITH MULTIPLE-CHANNEL DIGITAL PROCESSING

This application is the U.S. national phase of International Application No. PCT/FR2008/000499, filed 10 Apr. 2008 which designated the US and claims priority to French Application No. 0702668, filed 12 Apr. 2007, the entire contents of each of which are hereby incorporated by reference.

The invention relates to high frequency broadband receivers.

In receivers of this kind, which are used in different fields, the receive subsystem generally starts with a low noise front end amplifier coupled to the antenna, often via an antenna filter. Then there are one or more changes of frequency, to arrive at a lower frequency useful signal which is therefore easier to process. It is common to digitise this useful signal for subsequent processing.

A current trend is to place the analogue-to-digital conversion as far upstream as possible in the receive subsystem. Different public elements have reported this.

This trend is used, inter alia, in the field of software radio. The article by J. Mitola, "*Software Radios Survey, Critical Evaluation and Future Directions*", IEEE National Telesystem Conference, Washington, DC, May 19-20, 1992, describes the general principles of software radio.

There is a known article by B. Denby et al., "*Towards a software-radio enabled broadcast media navigator*", 4th EURASIP Conference on Video/Image Processing and Multimedia Communications, 2-5 Jul., 2003, Zagreb, Croatia. This article proposes digitising a signal of the AM band with a specialised computer-controlled card, and attempting to recover the demodulated signal in order to distinguish music and voice components.

This is done by using band-pass filters centred on selected modulation frequencies and by decimating the resulting signal. The result obtained is only partly satisfactory, as a single station is not really decoded, and a PC has to be used to do this, which limits the autonomy of the set-up.

These designs of radiofrequency receivers with digital processing are not satisfactory in every case. This is true particularly when a number of tracks or channels drawn from different carriers have to be received at the same time. The present invention sets out to improve the situation.

To this end, a high frequency receiver is proposed of the type having a receive subsystem comprising a low noise amplifier followed by processing stages with analogue-to-digital conversion.

The analogue-to-digital converter works on the output from the low noise amplifier, at a selected rate (F_e) which corresponds to band-pass sampling, and the processing stages comprise a custom circuit, with an input memory arranged to contain N successive digital samples, renewed at the chosen rate in blocks of M samples, a complex digital low-pass filtering function, of chosen cut-off frequency, operating on the input memory to supply N filtered digital samples, an M-periodic summing function on the N filtered digital samples, supplying M filtered and summed digital samples, an M×M discrete Fourier transform stage, operating on these M filtered and summed digital samples.

The digital signals on the M outputs of the Fourier transform represent M separate channels, the width of which is defined by the cut-off frequency of the above-mentioned low-pass filter.

The invention also relates to a radar apparatus comprising a receiver as described hereinbefore.

Further features and advantages of the invention will become apparent on studying the detailed description that follows, and the attached drawings, wherein.

Figure 2:
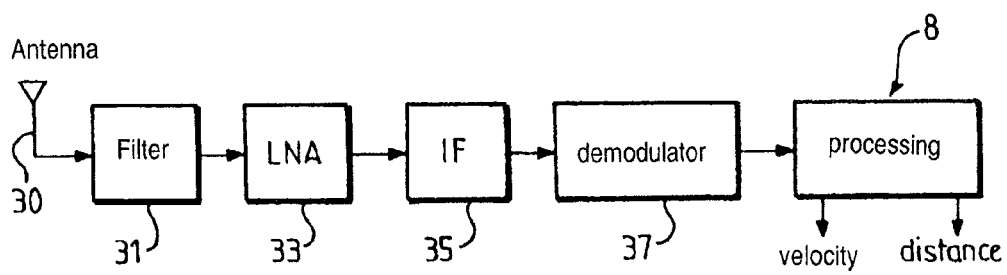
FIG. 2 shows the general operating diagram of a radar receiver.
Figure 3:
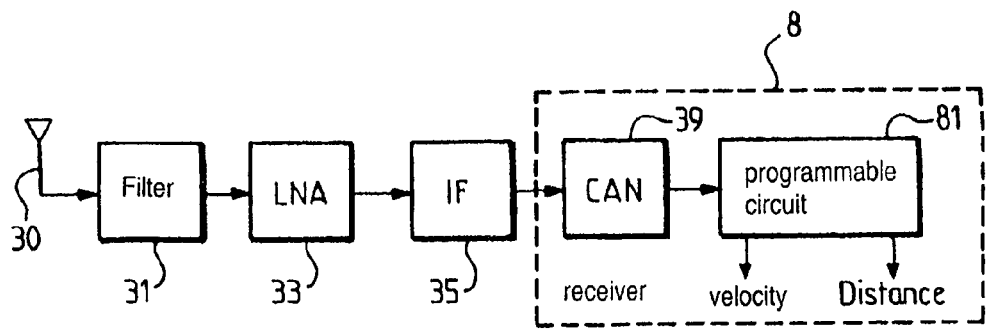
Figure 4:
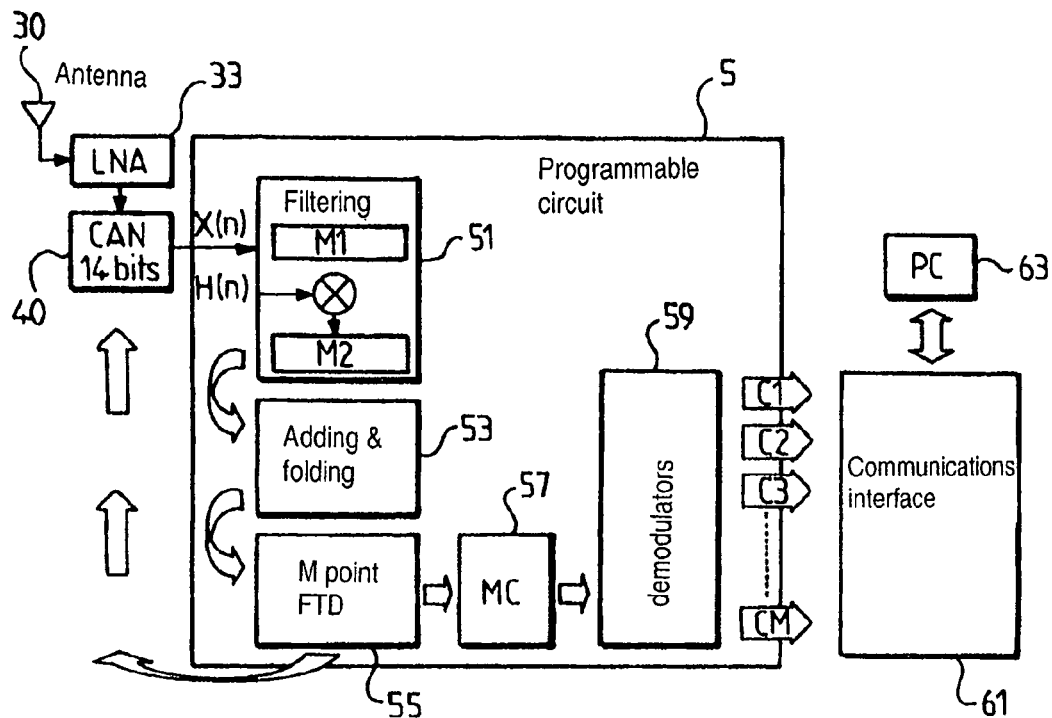
Figure 6:
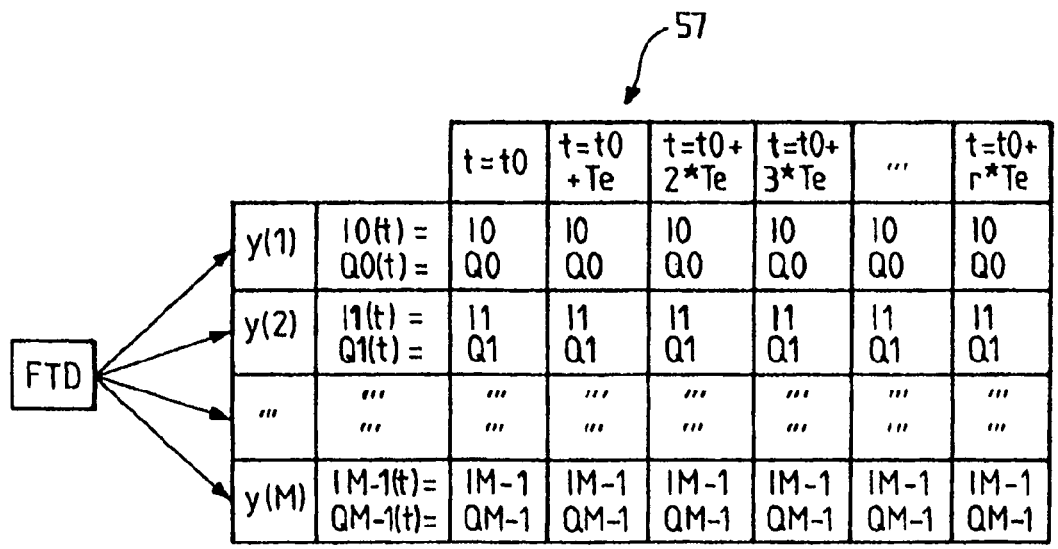
Figure 5:
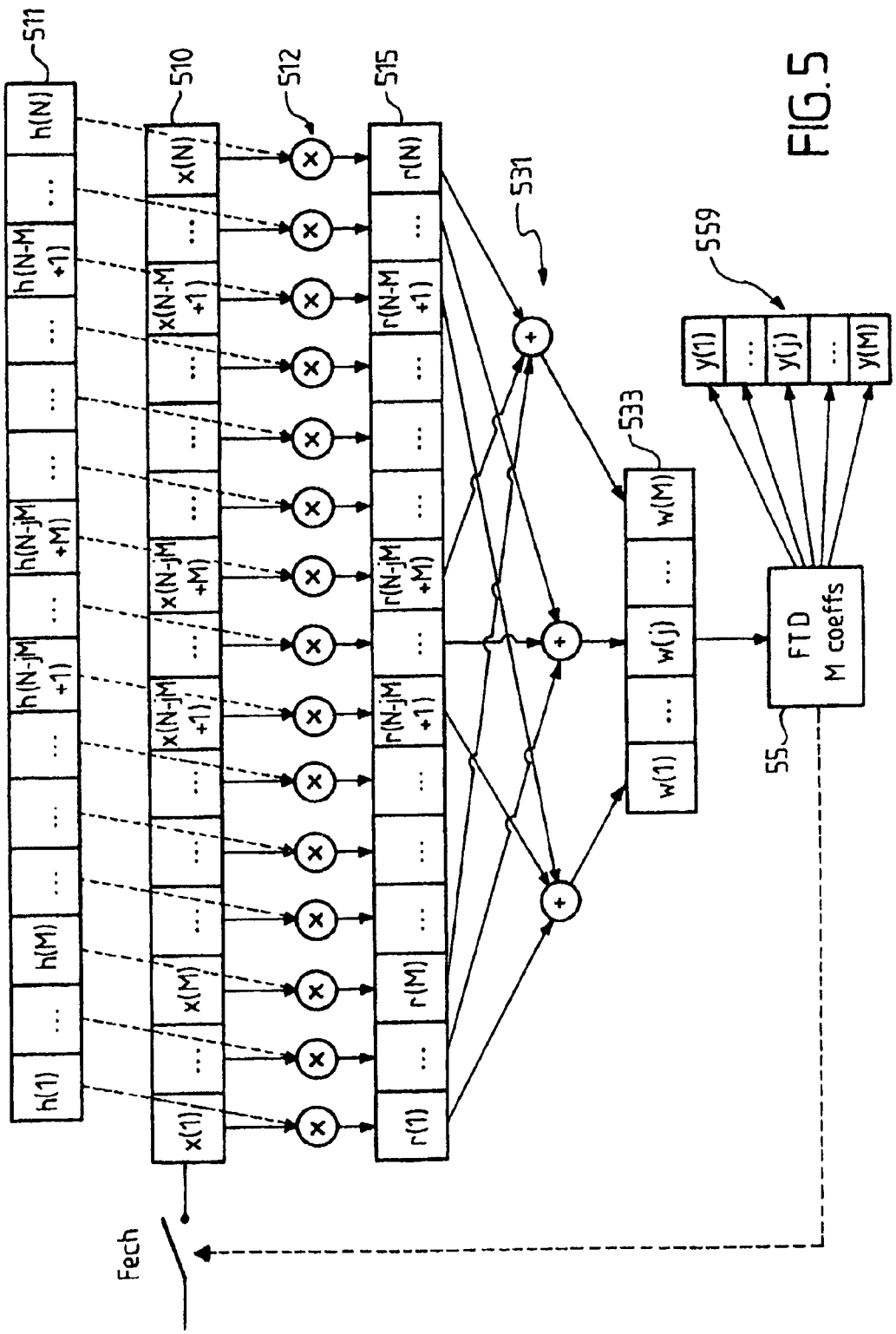
Figure 7:
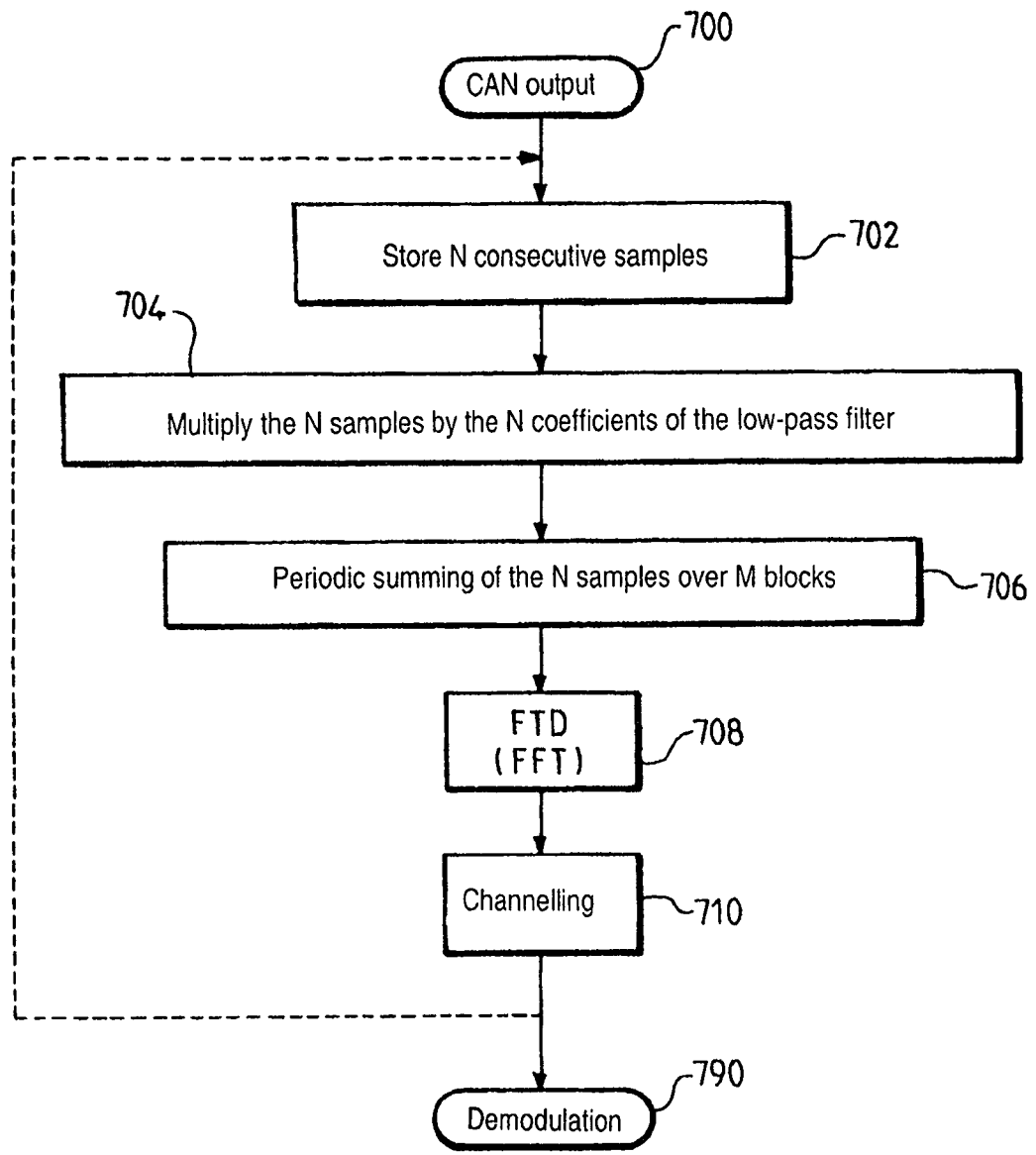
Figure 8:
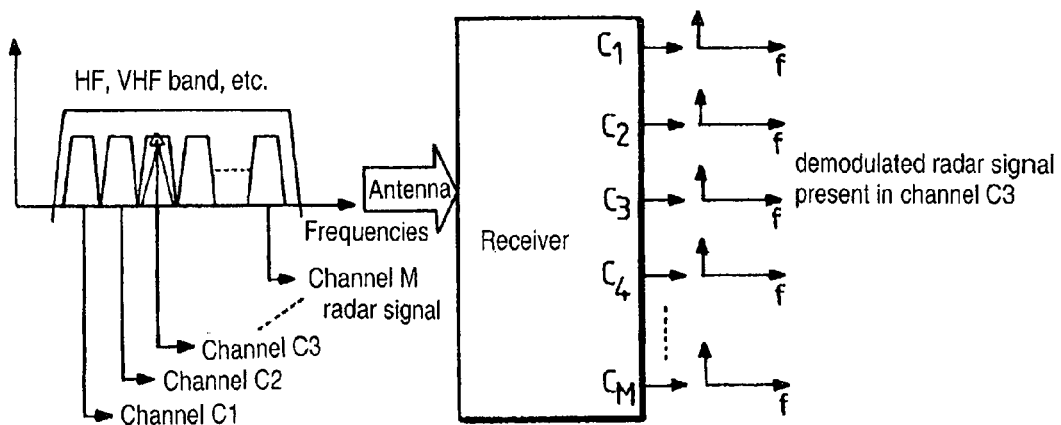
Figure 9:
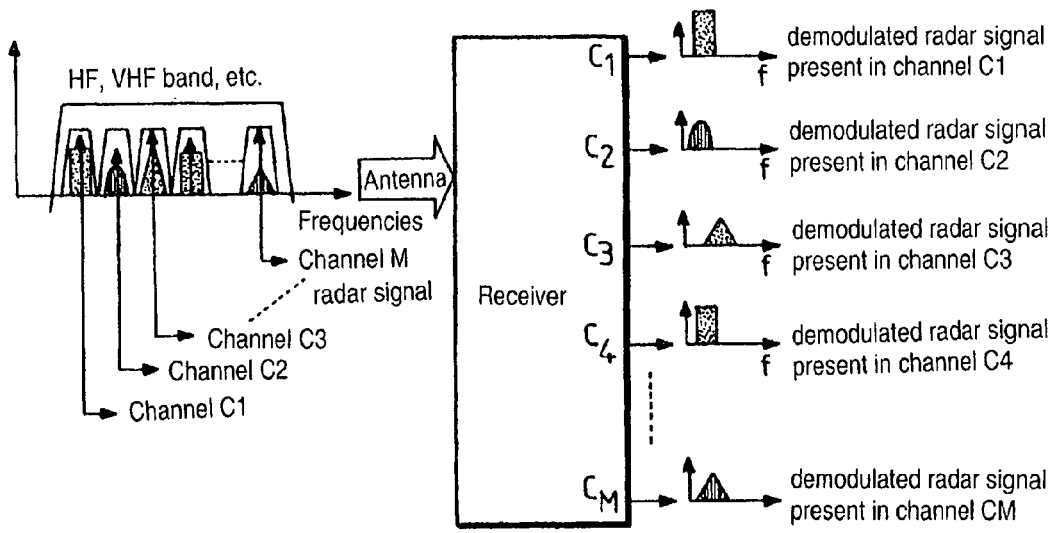
Figure 10:
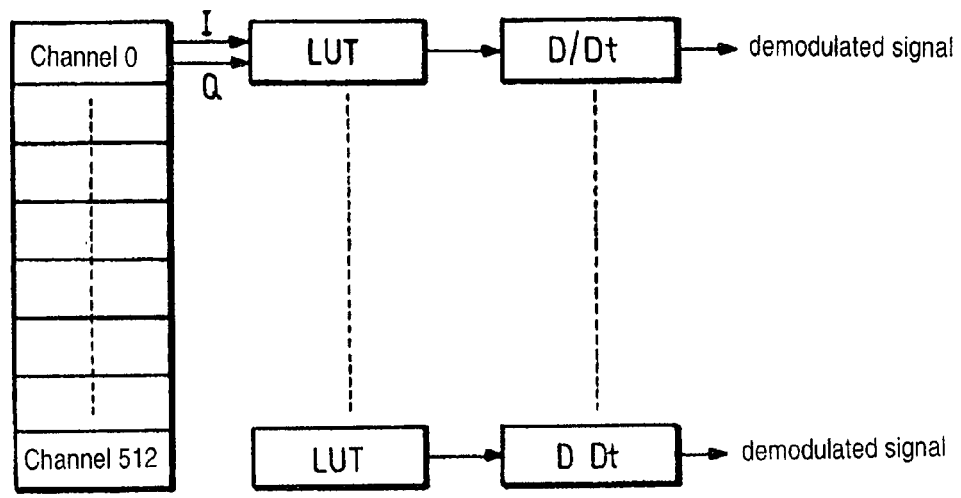
Figure 11:
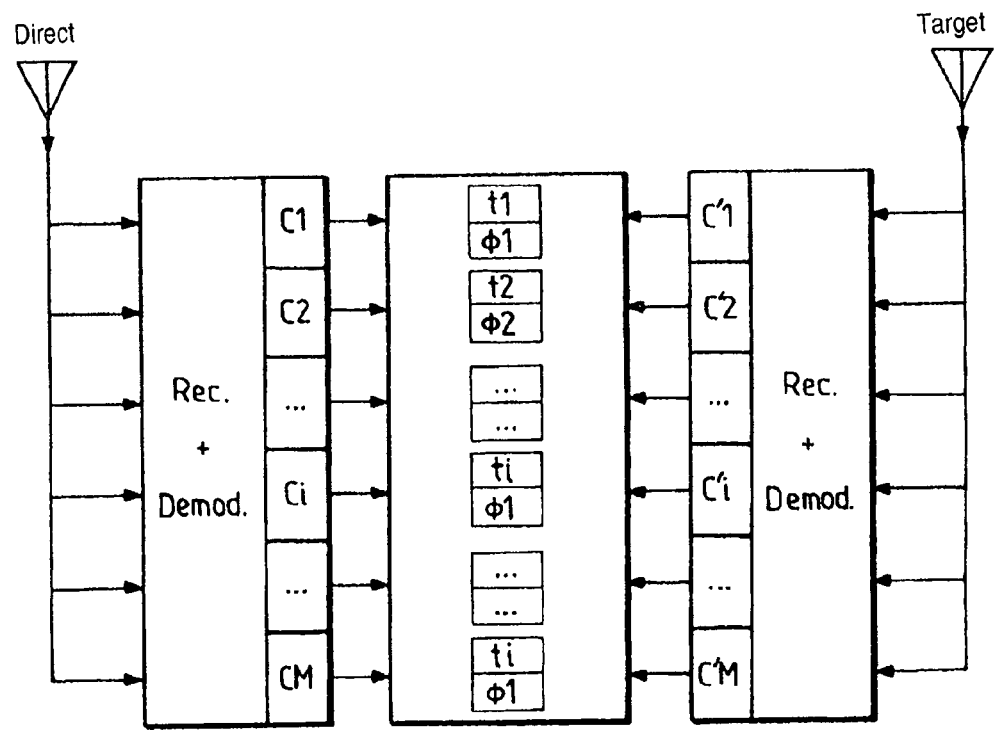

FIG. 3 shows the operating diagram of a radar receiver according to FIG. 2, in which the receive subsystem is digitised after a change of frequency, FIG. 4 shows the general operating diagram of one embodiment of the proposed receiver, FIG. 5 is a more detailed diagram of part of the receiver in FIG. 4, FIG. 6 is a more detailed diagram of another part of the receiver in FIG. 4, taking into account the two-component nature (I and Q) of the digital signal, FIG. 7 is a flow diagram of part of the processing carried out in the receiver of FIG. 4, FIG. 8 is a diagram with illustrations X-Y showing the output processing on 1 track, FIG. 9 is a diagram with illustrations X-Y showing the output processing on M tracks, FIG. 10 is a general operating diagram of the demodulation of components I and Q on the M output tracks, and FIG. 11 is an operating diagram of a passive radar processing which can be applied to the output signals from the receiver in FIG. 4.

The drawings and the description that follow essentially contain elements of a definite nature. They may serve not only to help make the present invention more comprehensible but in some cases may also contribute to its definition.

Figure 1:
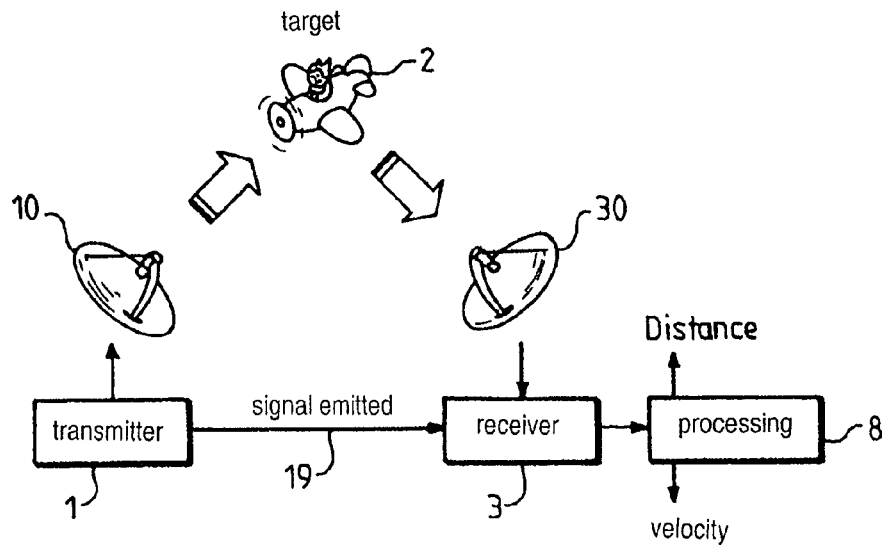
FIG. 1 shows a very general plan of a radar.

In the radar system in FIG. 1, a transmitter 1 supplies an antenna 10 with a radiofrequency signal, theoretically modulated, which irradiates a target 2. The radiation backscattered by the target 2 is picked up by the antenna 30 of a receiver 3, which also receives the signal 19 emitted, or an electronic representation 19 of the signal emitted, which defines it sufficiently, at least in its time characteristics.

From the signal or "echo" picked up by the antenna 30 and from the signal 19, the receiver carries out processes which make it possible to tell the speed and/or the distance from the target 2. In principle, the distance processes are linked to propagation times, and the speed processes to Doppler-effect frequency shifts.

The general construction of a radar receiver is shown in FIG. 2. After the antenna 30 and its optional radiofrequency band filter, there is generally a low-noise high frequency amplifier 33, followed by at least one frequency changing stage 35 (or IF for "intermediate frequency"). The remainder of the receive subsystem contains a demodulation function 37, followed by a radar processing stage 8, which provides the processing that makes it possible to determine the speed and/or the distance from the target 2, as indicated previously.

In more detail:

the antenna 30 is adapted to the band used, like its band-pass filter 31, for selecting a frequency band in which the radar signal is present, the low noise amplifier 33 corrects the level of the signal received without contaminating it with noise, the frequency changing stage 35 is a frequency converter. It carries out transposition of the signal received (coming from the generally high frequency antenna) to a so-called intermediate frequency (IF) which is lower or even zero. This stage 35 requires the presence of a local oscillator (not shown) which generally has to be synchronous with the transmitter, in the sense that the deviation in frequency and phase between this local oscillator and the oscillator of the transmitter has to be known or determinable;

a demodulator for baseband recovery of the signal emitted;

a processing block for determining the data on speed and distance of the target.

Modern radar receivers are digitised as illustrated in FIG. 3, for example. After stage 35 at intermediate frequency (IF) there is an analogue-to-digital conversion 39 referred to as "complex" because it has two components, in the manner of complex numbers. Most often, component I (in phase) and component Q (in quadrature) are distinguished. These two components make it possible to reflect precisely the amplitude and phase of a sinusoidal signal.

In a digitised radar receiver, the demodulation function is no longer as clearly distinct. This is why there is a tendency to regard the analogue-to-digital conversion 39 as being part of the processing 8. The actual treatment processes 81 are then carried out on these digital signals. And they may for example be carried out at least partly in a programmable circuit, which may be of the digital signal processor type ("DSP" short for Digital Signal Processor, microprocessor, or "FPGA" for Field Programmable Gate Array).

When the radar transmitter and the receiver are close together, (typically, using the same antenna), this is termed monostatic radar. The term bistatic radar is used when the emitting and receiving locations are separate.

From another point of view, conventional radars, which themselves emit, are referred to as "active". The terms "passive" or opportunistic radars refer to those that use emissions that are already in existence for other purposes, such as for example:

analogue radio and television broadcasting signals, FM and TV, digital radio and television broadcasting signals, DAB, DVB-S and DVB-T, GSM signals.

On the other hand, satellite signals cannot be used at present, as their power is too low for exploitation.

Passive radar is an example of a situation in which the intention is to receive a number of emissions at the same time. Hence the need to use a number of receive subsystems. The present invention sets out to propose a more efficacious approach.

FIG. 4 is the general outline diagram of a receiver as proposed herein.

As before, there is the antenna 30 adapted to the band used (by its band-pass filter, not shown), then the low noise amplifier 33. The analogue-to-digital converter 40 operates on the output of the low noise amplifier without any prior change of frequency. The remainder of the processing may be carried out in a programmable circuit 5, as will be described hereinafter. The outputs may go towards a communications interface 61 and then a microcomputer 63 for post-processing.

In the example described here, the antenna 30 and the low noise amplifier 33 are integrated in a ONEFORALL-SV9510 antenna. The analogue-to-digital converter 40 is a circuit AD9433 manufactured by Analog Devices, and the programmable circuit 5 is a Stratix EP2S180 FPGA circuit manufactured by Altera, suitably programmed to contain a computer code that carries out the above-mentioned functions. It would also be possible to use another specialised circuit of the ASIC type instead of an FPGA. Other elements and circuits which the skilled man will recognise may also be used.

The processing carried out by the programmable circuit 5 will now be described, with reference to an example, to assist with understanding. The example is of a frequency modulation radio band, known as the FM band, which ranges from about 88 to 108 MHz. Transmitters are spaced at about 200 to 400 kHz. And each one transmits with a modulation excursion limited to about 100 kHz (bandwidth 200 kHz).

In the example, the analogue-to-digital converter 40 may have a sampling rate F_e of 43.9 MHz, and operate over 14 bits. The sampling period Te is therefore slightly less than 23 nanoseconds.

The processing then comprises the four steps S1 to S4 described hereinafter, with reference to FIG. 7.

S1—Filtering

This step is carried out by a unit 51 in which N successive digital samples coming from the analogue-to-digital converter 40 (reference 700 in FIG. 7) sequentially fill a FIFO memory 510 having N stages (operation 702 in FIG. 7). The memory 510 is referred to as "memory M1". In the example, the size of this memory M1 is N×14 bits. There is also N=K*M, for reasons which will be understood hereinafter.

In addition, N coefficients have been stored, at 511, with the same precision as the samples obtained from the analogue-to-digital converter 40. These N coefficients correspond to the coefficients of a low-pass Butterworth band-pass filter $F_{1p}$. This filter is preferably of the finite impulse response type (FIR), although other filters may be used, at least in some cases where stability is not critical.

In the example, the precision of each of the coefficients is 14 bits, and the cut-off frequency $F_{1p}$ is 100 kHz, i.e. the modulation bandwidth of an FM transmitter.

When the memory 510 is full, the N acquired samples that it contains are weighted by the respective N coefficients stored at 511 (operation 704). In other words, each filter coefficient weights an acquired sample by means of a multiplier 512.

The results of the product of the samples by the coefficients of the filter are recorded in a memory 515 of size N. In order to reflect the components I and Q of the signal, the coefficients of the filter are complex in nature. Consequently, the products of the memory 515 have to be seen as elements with two components I and Q. Using real filter coefficients, it would of course be possible to carry out only real and non-complex filtering.

S2—Adding and Folding

The next part of the processing takes place when the memory 515 is full and is carried out by a unit 53. It is then considered to be subdivided, in the order of sampling, into K blocks of M elements each.

These K blocks are added to one another by a summer 531 to produce a final single block of M values 533 (operation 706). The first element of the final block corresponds to the addition of all the first elements of the K blocks. The second element of the final block corresponds to the addition of all the second elements of the K blocks, and so on. The last element of the final block corresponds to the addition of all the last elements of the K blocks.

S3—Discrete Fourier Transform

When the step of adding and folding is finished, the block of M values is sent to the input of a discrete digital Fourier transform ("FTD") block 55 over M points (operation 708).

The outputs y(j) of this block correspond to the frequency decomposition of the input signal over two channels, I and Q. I corresponds to the real parts and Q to the imaginary parts of the frequency decomposition of the signal. The output 559 of this block corresponds to two signals I and Q having M values. The first values of I and Q, I0 and Q0, correspond to the zero hertz components of the input signal. The second values, I1 and Q1, correspond to the $F_e/M$ hertz components of the input signal. The third values, I2 and Q2, correspond to the 2*$F_e$/M hertz components of the input signal, etc. The last values, IM−1 and QM−1, correspond to the (M−1)*$F_e$/M hertz components of the input signal.

S4—Channelling (MC)

When the processing of the FTD is finished, the channelling (MC) block 57 carries out demultiplexing of the results temporally (operation 710). As shown in FIG. 6, the values I and Q corresponding to the same frequency are grouped over time. The outputs of this block correspond to I0, Q0, I1, Q1, . . . , IM−1 and QM−1(t).

When the channelling operation is finished, the result over M channels is sent to the next stages for demodulation. The circuit allows M new samples to be acquired at the input (return to operation 702). The memory M1 is then filled with these M new samples followed by the (K−1)*M most recent previous samples, while the M previous samples that entered first disappear. Steps S1 to S4 are then repeated.

The memory blocks such as 510, 511 and 515 described previously are useful for explaining the processing. Obviously, in practice, these blocks do not have to be distinct and may be part of the same memory. Similarly, the processing described may be carried out at least partly sequentially or serially.

Functionally, the above processing may be described as follows, referring to the above-mentioned non-restrictive example, where:

N=8192
K=16
M=512.

The sampling is carried out at $F_c$=43.9 MHz, i.e. about 44 MHz. It produces spectral folding on the FM band of approximately 88 to 108 MHz, expressed by the following Table:

| F_ini. (MHz) | 2*$F_c$ | 2*$F_c$ − F_ini |
|---|---|---|
| 88 | 87.8 | 0.2 |
| 108 | 87.8 | 20.2 |

The low-pass filtering with a cut-off at 100 kHz relates all this to its low frequency variations. There is considerable over-sampling as the sampling rate is 43.9 MHz.

It is therefore possible to average out the samples. These averages will be comparable to one another, provided that the same periodicity is respected as each average is constructed. The formula Eq. 1 given as an example complies with this condition.

$$r(j) = \sum_{i=0}^{K-1} x(j+iM) * h(j+iM) \quad \text{(Eq. 1)}$$

Thus, the information contained on the FM band has been condensed into low frequency, with insufficient sampling to represent the FM carrier frequencies but broadly sufficient to find their modulation(s).

Two successive averages may be considered as being offset in time relative to one another by a sampling period Te. Consequently, the frequency of operation of the discrete Fourier transform is $F_f$, with $F_f$=51.2 MHz in this example.

The Fourier transform carried out over M points analyses the desired modulations, step by step over time, over M channels. In the example, with $F_f$=51.2 MHz and M=512, 512 channels of 100 kHz are obtained at the output.

As will be apparent in the light of the foregoing, the sampling frequency and the operating frequency of the FTD are slightly different. In a variant, the samples of the memory 510 may be interpolated before the step S2 or during it, to take account of this difference in frequency.

The skilled man will realise that this is bandwidth sampling rather than Nyquist sampling, in which the intention was to reflect precisely the amplitude and phase of the carrier.

The skilled man will understand that the WOLA algorithm works on the basis of the over-sampling of $F_e$ relative to $F_{1p}$. When one takes account of the FIFO nature of the memory 510, the equation Eq. 1 may be seen as a circular convolution of each sample x(j) by the low-pass filter h(j), with a sampling frequency of $F_e$/M.

Consequently at the input of the FTD, there is a set of M samples, this set being renewed at a rate of $F_e$/M. On the other hand, the "frequency sensitivity", or characteristic frequency of these samples, remains linked to the initial sampling rate, namely $F_e$.

The FTD over all the r(j) thus discriminates K spectral folds in relation to the sampling frequency $F_e$. The overlap obtained is (K−1)/K, because only M new samples out of K*M are renewed at each cycle S1 to S4. This is what makes it possible to maintain good temporal cohesion.

The signal is then processed in order to recover the signal on each channel defined as hereinbefore. As shown in FIGS. 8 and 9, this block makes it possible to demodulate the signal on a particular channel (FIG. 8), or over all the channels (FIG. 9).

The demodulation may be carried out by computer processing and is a function of the type of modulation used during transmission.

Thus, for a frequency modulation (FIG. 8), tangent arc-type processing is carried out in order to restore the data. For amplitude modulation (FIG. 9), an envelope detector comprising a low-pass filter is used.

An embodiment of the demodulation means is shown in FIG. 10 by way of example. The demodulation unit 59 comprises a series of correspondence tables LUT(i) each associated with a channel at the output from the block 57. Generally, the tables LUT(i) may be implemented in the form of 512 separate tables or one overall table combining all these tables with an identifier for each table. Alternatively, it may also be possible to replace the tables with the corresponding mathematical formulae.

At the output from each table LUT(i), each pair of signals (I(i); Q(i)) corresponds to a digital value designating an angle. The resulting signal is then sent to a bypass which makes it possible to obtain the signal frequency at the output from the LUT(i), and the demodulated signal on each channel.

The foregoing description is in iterative form, in relation to the processing of a given series of samples. However, the receiver may operate at least partly in parallel, for example by channelling and demodulating the signals emanating from samples already processed by the folding and adding block, while the following samples are being processed by this same block.

The Applicant has established that the signal-to-noise ratio ("S/N") obtained at the output from the programmable circuit 5 is at a level which makes it possible to carry out radar processing on the demodulated signals. For example, S/N levels of 60 dB were achieved in the experiments carried out, confirming the value of applying the receiver according to the invention to the passive radars applied to the FM band.

The output of this circuit is digital and is connected to the computer 63 by the interface 61 for radar processing, to give it its proper title.

A passive radar is bistatic as the radar reception takes place as a result of the backscattering, by targets, of the emissions from one or more transmitters which exist on the ground for other reasons. Radar reception makes opportunistic use of these transmitters, which will be referred to here as "involuntary [radar] transmitters".

In general, the radar receiver and the involuntary transmitter are not at the same location. Moreover, the radar receiver does not directly have the time references of the involuntary transmitter: it only knows when it receives the signals emitted, and it knows its own position and that of the transmitter and hence its distance from the transmitter and hence the travel time of the waves between the two.

Let us consider a given time difference DT between the signal backscattered by a target and received by the radar antenna, on the one hand, and the signal which is also received by the receiver by direct propagation from the involuntary transmitter, on the other hand. It is known that the target is located on an ellipse, parameterised by DT, the foci of which are the involuntary transmitter and the radar receiver. The position of the target on this ellipse can be determined on the basis of the direction of reception of the signal received by the receiver, i.e. the axis of the antenna.

The movement of the target has the effect of varying the parameter DT. Moreover, this movement also has an effect on the backscattered signal, which the skilled man will know as the Doppler effect. Thus, it is known that a signal emitted by a transmitter to a receiver which are moving relative to one another undergoes a frequency shift proportional to the relative velocity of the transmitter and receiver. More precisely, this phase shift is a function of the affine projection of this velocity on the transmitter-receiver axis.

In the case of bistatic radars, as the target moves both relative to the involuntary transmitter and to the receiver, the signal undergoes a Doppler effect known as the bistatic effect which has two components consisting of the affine projections of the velocity vector of the target on the radial involuntary transmitter-target axis, on the one hand, and target-receiver axis, on the other hand.

In practice, the parameter DT is determined by correlating the signal emitted directly by the involuntary transmitter and the signal backscattered by the target. In fact, owing to the nature of the signal emitted by the involuntary transmitter, these signals can only be correlated with themselves. Consequently, the signal backscattered by the target has to be modified to take account of the bistatic Doppler phase shift and thus allow correlation with the signal emitted by the involuntary transmitter to determine the parameter DT.

One way of determining these parameters by trial and error is described in the article by Howland et al., "FM radio based bistatic radar", IEE Proceedings online no. 20045077, IEE 2005.

In short, this describes the processing of a bistatic radar with a somewhat specialised application on account of the use of the involuntary transmitter. Passive radars are described in different public elements.

This is true, first of all, of the Manastash project of the University of Washington, the description of which can be accessed using the following link:

http://klickitatee.washington.ed/Projects/Manastash/

In this project, Professor John Sahr of the electrical engineering department of the University of Washington developed a passive radar dedicated to environmental applications for monitoring the fluctuation in the ionospheric layer.

[It is also true of the article by Y. Zhao et al., "*Adaptive Baseband Architecture for Software-Defined Radar Application*", in Proc of IEEE CCECE 2003, Montréal, May 2003. This article reports on a radar receiver the structure of which comprises an analogue radiofrequency stage for receiving radar signals, an analogue-to-digital and digital-to-analogue converter, a processor designed for processing the signal (DSP) and a computer interface. This set-up was developed essentially for receiving radar signals supporting various types of FSK, BPSK, PSK and CHIRP coding. The characteristics of the signals emitted are computer-programmed on the DSP. The same set-up is used for sending radar signals]

There is also the article by R. Walke et al. "*An FPGA based digital radar receiver for soft radar*", Signals, Systems and Computers, 2000. Conference Record of the Thirty-Fourth Asilomar Conference on Volume 1, 29 Oct.-1 Nov. 2000 Page(s): 73-77 vol. 1. This article describes the set-up of a radar system dedicated to the formation of beams by calculation. The system is made up of N antennae equipped with an analogue filter, an analogue-to-digital converter and a digital receiver. The latter carries out baseband conversion using a local oscillator and a low-pass filter. The output of the digital receiver is a non-demodulated baseband signal.

Within the scope of the invention, as shown in FIG. 11, the channelled signals received directly from the involuntary transmitter (or direct signals) and those received from the target (or backscattered signals) are processed by the computer 63 or any other suitable processing means, to determine the time difference $t_i$ and the Doppler shift $\Phi_i$ on each channel.

The differences $t_i$ may be obtained by correlating, channel by channel, the demodulated direct signal and the demodulated backscattered signal. The Doppler shift may be determined by comparing, channel by channel, the spectra of the modulated direct signal and the modulated backscattered signal.

From a theoretical point of view, all the $t_i$'s should be identical and it is therefore possible to make do with a single calculation. However, to achieve greater precision, it is possible to determine several or all of the $t_i$'s and then average them out. It is also possible to sum the demodulated direct signals on the one hand and the demodulated backscattered signals on the other hand and to correlate these two sums of signals in order to obtain this same average.

As all the $\Phi_i/f_i$ ratios (where $f_i$ is the modulation frequency of the channel i) are theoretically equal, the same principle of averages can be applied to the Doppler shifts. However, in this case it is not possible to obtain the average in a single operation: first, all the $\Phi_i$ have to be calculated individually.

Other examples of radar treatments that can be applied to the demodulated signals are described in the publications: "*Traitement numérique du signal radar*" [*Digital processing of the radar signal*] by J J. Julié and R. Sapienza, Editions Hermes, 2004, "Digital processing of radar signals detailed" by Schuster, J. et al., Joint Publications Research Service in its East Europe Report (JPRS-EER-860010), p. 129-141 (SEE N86-20665 11-32), 1986, or "*Radar HandBook*" of M. I. Skolnik, 2nd Edition, McGraw-Hill Professional Publishing, 1990. Other post-processing may also be used, which need not be described here.

The description provided above has been written with reference to a radar application. However, the skilled man will recognise that the foregoing may be implemented in almost any "temporal" application of wave propagation.

Thus, the receiver described above can be used to search for clear frequencies, i.e. to search for channels that are free for radar emission. Other applications include coastal radars in the form of receivers located on buoys and operating in the HF/VHF/UHF range for detecting naval vessels and pleasure craft. Finally, the receiver described above could also be used for OFDM radars and in other special applications.

The skilled man will note that within the scope of these applications it is crucial to be accurate as to time. It is therefore necessary to digitise the signal in a so-called "complex" form, i.e. with a phase component, referred to as (I), and a quadrature component, referred to as (Q), and to apply a subsequent complex processing.

Other applications are less demanding in terms of time precision, and allow direct real processing which may optionally be supplemented by complex processing as described.

These applications include the concept of "Radio On Demand", i.e. the demodulation of the entire FM band simultaneously for the broadcasting of separate channels at different locations with a single receiver. One application may be found in the car, with the possibility of each passenger listening to a different station from a single receiver. Of course, this may also use RDS.

Another application is the idea of "cognitive radio", which aims to test the different radio channels available for actual broadcasting or simply for detection. Finally, the receiver may also be used as an AIS receiver, which operates over 88 channels of 25 kHz in the band 157-162 MHz, to prevent collisions.

As mentioned earlier, the skilled man will recognise that these applications do not require the same time precision and may be carried out more simply.

The invention also covers, as products, the software elements described, provided on any computer-readable "medium" (support). The term "computer-readable medium" encompasses magnetic, optical and/or electronic storage supports for data, as well as a transmission support or carrier, such as an analogue or digital signal.

The invention claimed is:

1. A high frequency receiver having a receive subsystem comprising:
    a low noise amplifier followed by processing stages with analogue-to-digital conversion, wherein an analogue-to-digital converter is configured to work on the output from the low noise amplifier at a selected rate ($F_e$) which corresponds to band-pass sampling, and the processing stages comprise a custom circuit with an input memory arranged to contain N successive digital samples, renewed at the chosen rate in blocks of M samples,
    a complex digital low-pass filter with a chosen cut-off frequency, said filter configured to operate on the input memory to supply N filtered digital samples,
    an M-periodic summer of the N filtered digital samples, said summer configured to supply M filtered and summed digital samples,
    an M×M discrete Fourier transform stage operating on the M filtered and summed digital samples, wherein the digital signals on the M outputs of the Fourier transform representing M separate channels of a width defined by the cut-off frequency of the low-pass filter,
    a channelling stage configured to aggregate over time the digital signals at the M outputs of the Fourier transform stage, and
    a demodulation stage configured to demodulate the aggregated channels and recover the original signal on each channel wherein the demodulation stage comprises an extrapolation of the tangent arc demodulation stage.

2. The receiver according to claim 1, particularly for time-sensitive reception, wherein the digital samples are complex digital samples with two components (Ii, Qi), at least from the low-pass filter.

3. The receiver according to claim 1, comprising a channelling stage configured to aggregate over time the digital signals at the M outputs of the Fourier transform stage.

4. The receiver according to claim 3 further comprising a demodulation stage configured to demodulate the aggregated channels and recover the original signal on each channel.

5. The receiver according to claim 4, wherein the demodulation stage comprises a low-pass filter comprising a bypass (D/DT).

6. The receiver according to claim 4, wherein the custom circuit is configured to carry out processes, at least partly in parallel.

7. The receiver according to claim 1, wherein the tangent arc type extrapolation is carried out by a correspondence table (LUT).

8. The receiver according to claim 1, wherein the custom circuit is a field programmable gate array (FPGA) or an application-specific integrated circuit (ASIC).

9. A radar comprising two antennas oriented in different directions, each one being connected to a receiver according to claim 1.

* * * * *